(12) United States Patent
Nishiyama

(10) Patent No.: US 6,919,227 B2
(45) Date of Patent: Jul. 19, 2005

(54) SEMICONDUCTOR PART OF COMPONENT MOUNTING, MOUNTING STRUCTURE AND MOUNTING METHOD

(75) Inventor: Kazuo Nishiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 241 days.

(21) Appl. No.: 10/210,683

(22) Filed: Jul. 31, 2002

(65) Prior Publication Data

US 2002/0195722 A1 Dec. 26, 2002

Related U.S. Application Data

(62) Division of application No. 09/398,100, filed on Sep. 17, 1999, now Pat. No. 6,534,875.

(30) Foreign Application Priority Data

Sep. 25, 1998 (JP) .......................... P10-271740

(51) Int. Cl.[7] .......................... H01L 21/44; H01L 21/48; H01L 21/50
(52) U.S. Cl. ...................... 438/109; 438/107; 438/108; 257/737; 257/738; 257/773; 257/780
(58) Field of Search ................................ 257/737, 738, 257/786, 780, 773, 778; 361/767; 438/107–109

(56) References Cited

U.S. PATENT DOCUMENTS 5,490,324 A * 2/1996 Newman ..................... 29/830
5,598,036 A * 1/1997 Ho .............................. 257/738
5,828,128 A * 10/1998 Higashiguchi et al. ....... 257/738
6,175,158 B1 * 1/2001 Degani et al. .............. 257/777
6,184,586 B1 * 2/2001 Matsushima ................ 257/780

* cited by examiner

Primary Examiner—David A. Zarneke
Assistant Examiner—Thanh Y. Tran
(74) Attorney, Agent, or Firm—Sonnenschein, Nath & Rosenthal LLP

(57) ABSTRACT

A semiconductor part for component mounting, a mounting structure and a mounting method providing ample surplus wiring pitch and width between terminals in order to improve the strength of the connection with the printed circuit board in view of the recent trends towards a greater number of pins and greater component mounting density on printed circuit boards or substrates. A semiconductor component for mounting has area terminals comprised of area terminals mounted on the outer circumferential side and area terminals mounted on the inner circumferential side of the board. The area terminals on the outer circumferential side of the board are arranged with a larger pitch and or diameter than the area terminals on the inner circumferential side. A mounting method and mounting structure having land terminals arrayed on a printed circuit board or substrate with the same arrangement as the area terminals of the semiconductor component, and the land terminals are connected with the area terminals by a conductive bonding agent.

3 Claims, 8 Drawing Sheets

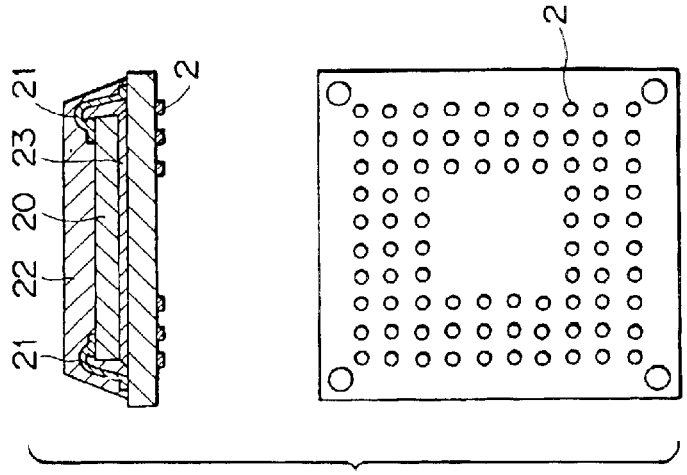
F I G. 5B
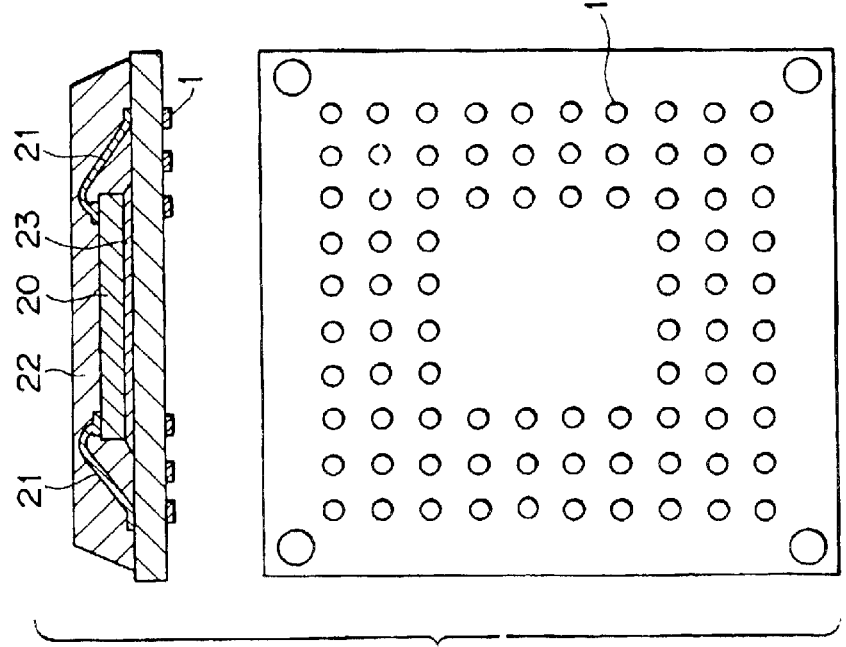
F I G. 5A

US 6,919,227 B2

SEMICONDUCTOR PART OF COMPONENT MOUNTING, MOUNTING STRUCTURE AND MOUNTING METHOD

CROSS REFERENCE TO RELATED APPLICATIONS

This application is a divisional Patent Application under 37 CFR 1.53(b) based on Parent application Ser. No. 09/398,100, filed Sep. 17, 1999 now U.S. Pat. No. 6,534,875 which claims priority to Japanese Application No. P10-271740, filed Sep. 25, 1998.

BACKGROUND OF THE INVENTION

1. Field of the Invention

The present invention relates to a semiconductor part for component mounting, a mounting structure and a mounting method.

2. Description of Related Art

Strong demands have been made in recent years for portable electronic equipment such as digital cameras, digital portable telephones and notebook type personal computers that are thinner, are more compact and have lighter weight. Therefore, to what extent the surface mounting density of the semiconductor components used in the above devices can be increased has become an important technical issue.

To cope with this trend, the development of compact CSP (chip scale packages) typified by packaged ICs such as QFPs has progressed and some compact chip scale packages are now available.

These chip scale packages (CSP) incidentally, as can be seen from their other name of FP-BGA (Fine Pitch BGA) are designed for a compact BGA (Ball Grid Array) and their connection pin (hereafter called area terminals) array usually have an 0.8 mm pitch (BGA pitch is 1.27 mm.).

However, to cope with semiconductor LSI chips having higher density and more functions, the scope of the area terminal layout has shown a tend to continually increase and even the size of supposedly small CSP (chip scale packages) are becoming larger.

In order to allow these semiconductor LSI chips to handle a higher component mounting density by accommodating more pins, an even finer pitch is required in the area terminal array.

A chart of semiconductor assembly technology and mounting technology progress accompanying the miniaturization of semiconductor LSI devices is shown in Table 1 below. As can be seen, the number of area terminals has drastically increased to keep pace with higher density, systemization and miniaturization of semiconductor LSI devices. Table 1 also shows that in response to these developments, the CSP and BGA array pitch has become smaller and smaller.

| | Semiconductor Technology | | | | |
|---|---|---|---|---|---|
| Year | Design scale | Number of connection pins (general-purpose) | Aluminum electrode pitch | CSP terminal pitch | BGA terminal pitch |
| 1997 | 0.25 μm | 100–295 | 80 μm | 500 μm | 1.27 μm |
| 1999 | 0.18 μm | 117–400 | 70 μm | 400 μm | 1.27 μm |
| 2001 | 0.15 μm | 137–469 | 60 μm | 400 μm | 1.00 μm |
| 2003 | 0.13 μm | 161–551 | 50 μm | 300 μm | 1.00 μm |
| 2006 | 0.10 μm | 205–699 | 50 μm | 300 μm | 0.80 μm |

In a more specific description given while referring to the drawings, the CSP area terminals 1 and 2 are shown respectively in FIGS. 5A and 5B. A 0.8 mm pitch array is shown in FIG. 5A and a 0.5 mm pitch array is shown in FIG. 5B. In these figures, the reference numeral 20 denotes the (LSI) chip, 21 denotes a bonding wire, 22 denotes the plastic mold, and 23 denotes the bonding agent (adhesive).

Upon comparing these two pitch arrays in FIGS. 5A and 5B, it can be clearly observed that as the package size area terminal 2 becomes extremely small when the terminal array has a 0.5 mm pitch as shown in FIG. 5B.

FIG. 6 is a graph showing the correlation of package size and number of area terminal pins for each type of CSP used in portable telephones and handy digital video cameras on the market up till now. The graph shows package size increasing due to the trend to use a greater number of pins, and the package size shrinking from miniaturization with a 0.5 mm pitch array. In other words, the graph clearly shows that high density mounting is indispensable.

However, when miniaturizing the pitch array of area terminals in this way, reducing the size of the terminals is of course unavoidable. Even when mounting (connecting) chip scale packages (CSP) on boards, there is a large possibility of the connection strength deteriorating due to factors such as heat stress after mounting.

On the other hand, FIG. 7A shows the area terminals 1 arrayed with an 0.8 mm pitch on a CSP and at a 0.5 mm pitch in FIG. 7B along with the repositioned wiring 3 and 3a. As this figure clearly shows, more wiring is passing towards the inner side between the area terminals 1a and 1a rather than on the outermost side.

When the diameter of the area terminals of the 0.8 mm pitch array have for example been set to 0.4 mm, the L/S (line & space) for each wire is 30.8 μm (wiring pitch of 61.5 μm). However when the area terminal array is at a 0.5 mm pitch, and the diameter of the area terminals becomes an even smaller 0.25 mm, the wiring between those terminals have an L/S of 19.2 μm (wire pitch is 38.5 μm) so that obviously even finer wiring required.

Thus, when many wires are laid between the area terminals and the gap between the terminals becomes exceedingly small, then fine complex processing also becomes necessary on the board. For instance, use of built-up multilayer wiring board such as in the multilayering to rout the wiring 5 to the land terminal 4 is required as shown in FIGS. 8A and 8B.

SUMMARY OF THE INVENTION

In view of the above problems with the conventional art, and in view of recent trends toward high density component mounting and increasing the number of pins, this invention therefore has the object of providing a semiconductor part for component mounting, a mounting structure and a mounting method wherein the connection to the printed circuit board is strong and the wiring pitch betweem terminals has sufficient width margin.

To achieve the above objects of the invention, a semiconductor part for component mounting of the invention, having area terminals on the substrate is characterized in that, of the area terminals that are arrayed on the outer and inner circumferential sides of the substrate, those area terminals on the outer circumferential side are arrayed with a larger pitch and/or diameter than the area terminals on the inner circumferential side.

To still further achieve the above objects, a mounting structure of this invention comprised of a semiconductor part for component mounting having area terminals, and having land terminals arrayed on the outer and inner circumferential sides of the board is characterized in that the land terminals on the outer circumferential side are arrayed with a larger pitch and/or diameter than the land terminals on the inner circumferential side and further characterized in that a conductive bonding solution is applied between the area terminals and land terminals.

In this invention, the area terminals on the substrate or board are comprised of area terminals arrayed on the outer and inner circumferential sides of the substrate or board. However, in the semiconductor part arrayed with outer circumferential area terminals having a larger pitch and/or diameter than the inner circumferential area terminals, the area terminals may also be arranged in a flip chip bump array.

These area terminals may also be installed on the CSP interposer board, or may be installed on the BGA (ball grid array) or the LGA (land grid array) interposer boards or may be installed on the MCM (multi chip module) sub-board.

The area terminals of the semiconductor part of this invention possess a diameter large enough to allow positioning on the outer circumferential side of the board or substrate which is subject to the greatest heat stress, and the strong connection is both stable and reliable so that the connection is more than sufficient to withstand the heat stress applied after mounting.

The pitch array becomes finer (smaller) the more the area terminal is positioned on the inner side away from the outer circumferential side so that the number of terminals can be increased and the board is able to cope with recent and future trends towards increased numbers of pins.

The larger pitch array of the area terminals close to the outer circumference further signifies that the wiring circumferential terminals has an ample margin and that easier mounting and lower board wiring costs can be achieved. The larger pitch array also means larger wires (or wiring) can be utilized so that high-speed, high frequency mounting can be achieved since losses due to resistance in the wiring are reduced.

BRIEF DESCRIPTION OF THE DRAWINGS

FIGS. 5A and 5B are respectively a side view (5A: 0.8 mm pitch CSP) and a flat view (5B: 0.5 mm pitch CSP) showing the area terminal array of the chip scale package of the conventional art.

DETAILED DESCRIPTION OF THE PREFERRED EMBODIMENTS

Figure 1A:
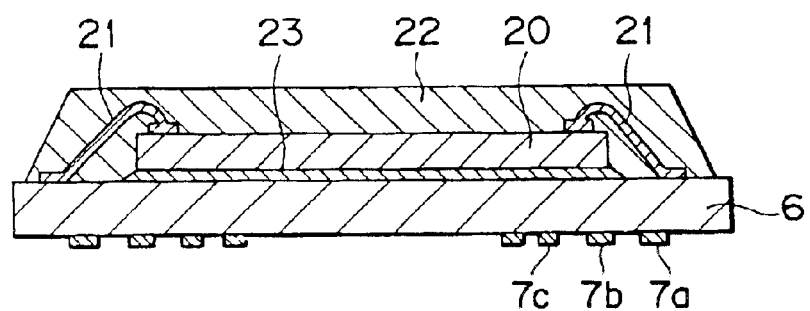
FIGS. 1A and 1B are respectively a fragmentary cross sectional view (1A) and a bottom view (1B) showing the array of the area terminals for the chip scale packages of this embodiment of this invention, wherein outermost row has pitch of 0.8 mm and inner roll has pitch of 0.65 mm and two rows further inward have pitch of 0.5 mm.
Figure 1B:
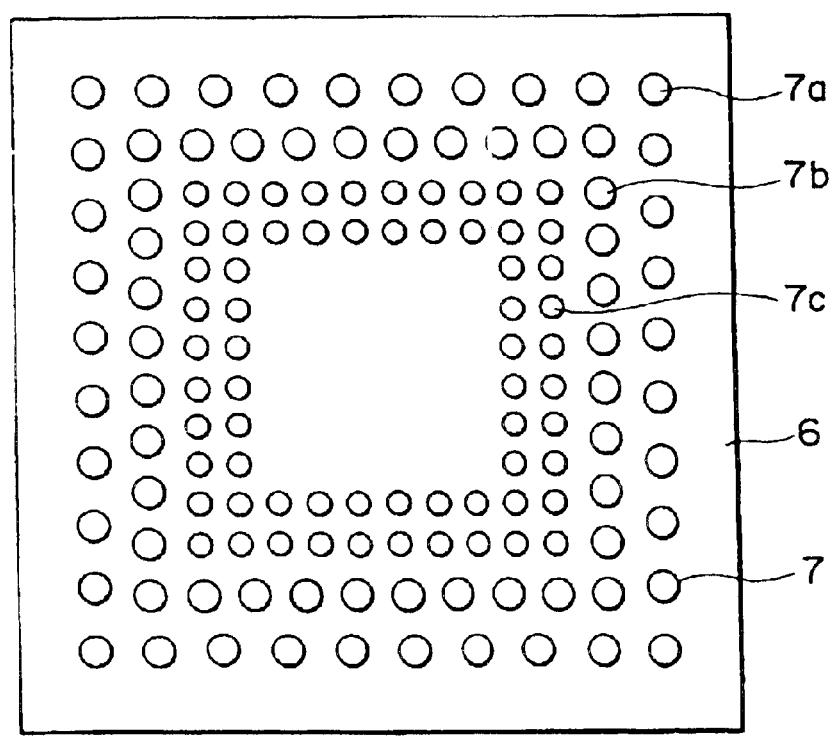

The preferred embodiments of this invention will now be described in specific detail while referring to the accompanying drawings. The scope of this invention is not however limited by such drawings or descriptions. pitch of 0.8 mm are positioned on the outer circumference of an interposer board 6 of the CSP as shown in FIGS. 1A and 1B. On the inner side of the area terminal 7 row is one row of mid-size area terminals 7b at a pitch of 0.65 mm and still further towards the inside of the interposer board 6 are two rows of small area terminals 7c arrayed at a pitch of 0.5 mm. In FIG. 1A, the reference numeral 20 denotes an LSI (large scale integrated circuit) chip, 21 is bonding wires, 22 is a plastic molded package, and 23 is a bonding solution (adhesive). The total number of area terminals 7 in this state is 136 pins. In contrast, in the conventional arrangement of area terminals all of the same diameter arrayed at a 0.8 mm pitch, the total number of area pins does not exceed 96 pins.

Figure 2A:
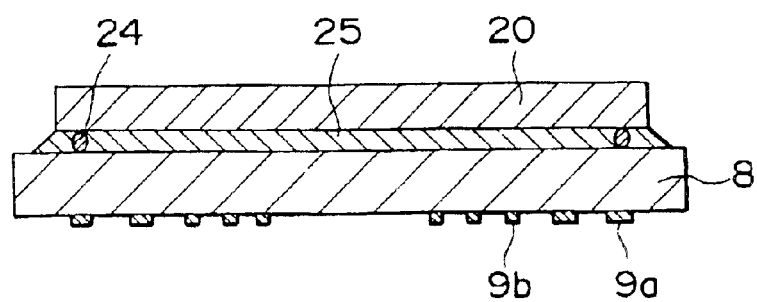
FIGS. 2A and 2B are respectively a lower cross sectional view (2A) and a flat plan view (2B) showing the array of the area terminals for the flip chip type chip scale packages of this embodiment of this invention, wherein outermost two rows have pitch of 0.8 mm and inner three rolls have pitch of 0.5 mm.
Figure 2B:
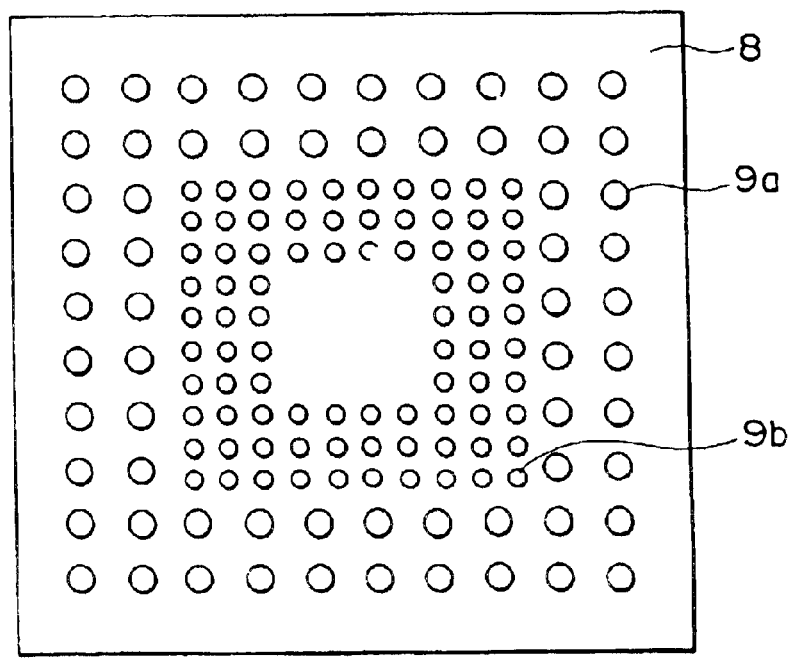

Next, in the flip type CSP interposer board 8 in FIG. 2, two rows of mid-size area terminals 9a at a pitch of 0.8 mm are arrayed on the outermost circumference of the interposer board 8. On the inner side of the area terminal 9a are three rows of small area terminals 9b at a pitch of 0.5 mm. In the arrangement in this figure, the reference numeral 24 is a bump and 25 is the bonding solution (adhesive). Of course, in the case of FIG. 2, the mid-size area terminals 9a and the small area terminals 9b can be combined at 0.8 mm pitch and a 0.65 pitch of at a 0.65 mm and a 0.5 mm pitch.

Figure 3A:
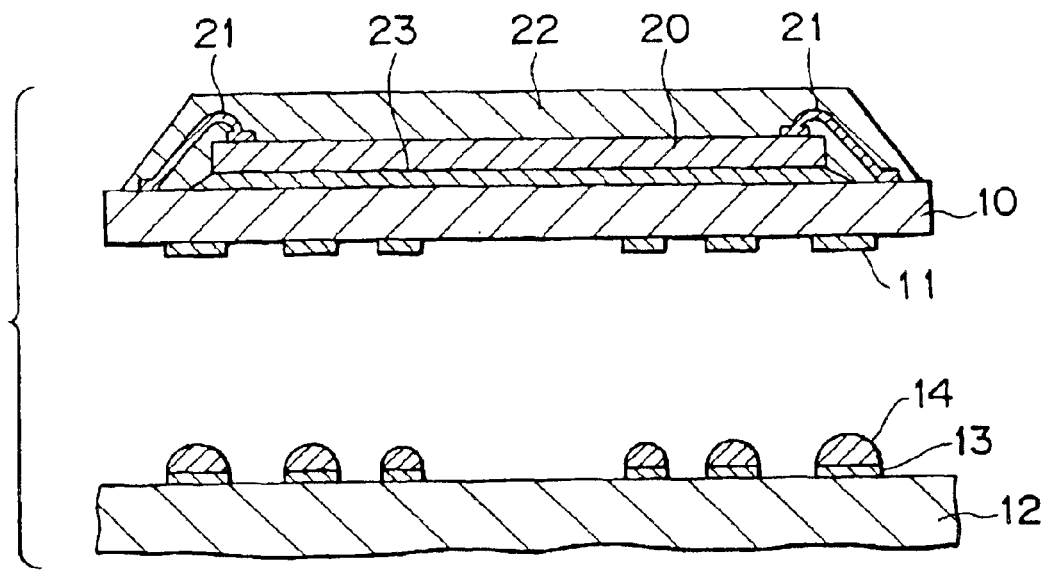
FIGS. 3A and 3B are process views showing the mounting procedure for the chip scale packages of the embodiment of this invention with (3A) as the view prior
Figure 3B:
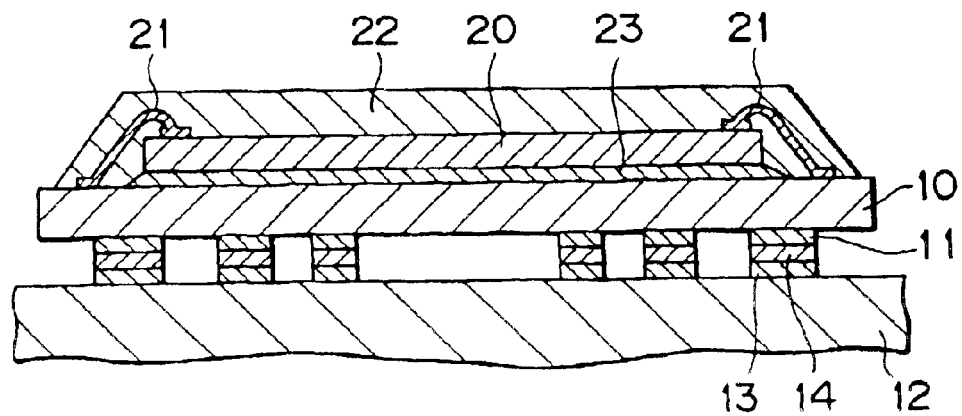

The process for the CSP with the area terminals arrayed as described above onto the printed circuit board is shown in FIG. 3A. The area terminals 11 on the interposer board 10 may for instance be connected to the land terminals of the printed circuit board 12 with a conductive bonding material such as a solder cream 14. The status after connection is shown in FIG. 3B.

Naturally, the printed circuit board has the same terminal array (arrangement) as the interposer board/substrate. The closer to the outer circumference of the board, the larger the diameter and pitch of the land terminals. The farther to the inside of the board, the smaller the diameter and pitch of the land terminals. Solder is preferably used as the conductive bonding material. An advantage of using solder is that a self-alignment effect is obtained due to the melting of the solder. This self-alignment contributes greatly to obtaining a strong highly reliable connection, particularly when connecting printed circuit board land terminals and area terminals on the outermost circumference of the board/substrate.

Besides the above mentioned embodiments, this invention is also applicable to BGA interposer boards. In this case, the number of pins for the area terminals can be increased even further by changing the commonly used pitch array of 1.27 mm to a pitch of 1.27 on the outermost circumference and to a pitch from 1.0 to 0.8 on the inner circumference to further miniaturize the area terminal array on the inner circumferential side to allow handling recent and future trends toward increasing the number of pins.

Also, besides the above example, this invention can also be applied to area terminals on the recently popular MCM sub-boards and the same effect can be obtained. Also, in the previously mentioned examples, both the pitch and diameter of the area terminals were specified as increasing near the outer circumference however in this invention making a change to increase just the outer circumference pitch or the diameter is sufficient.

Figure 4:
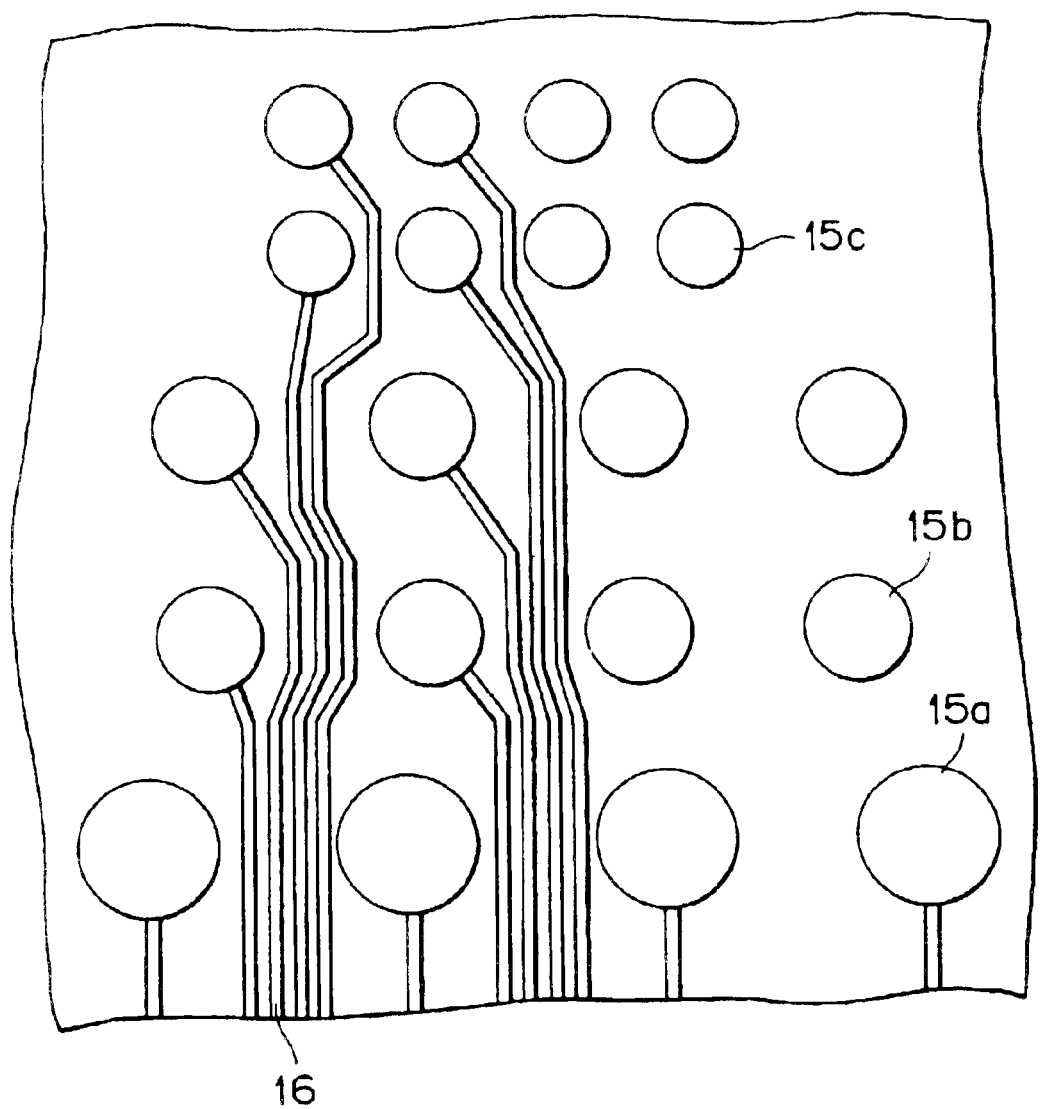
FIG. 4 is a pattern view of the area terminal (or land terminals of the board/substrate) array status of this invention.
Figure 6:
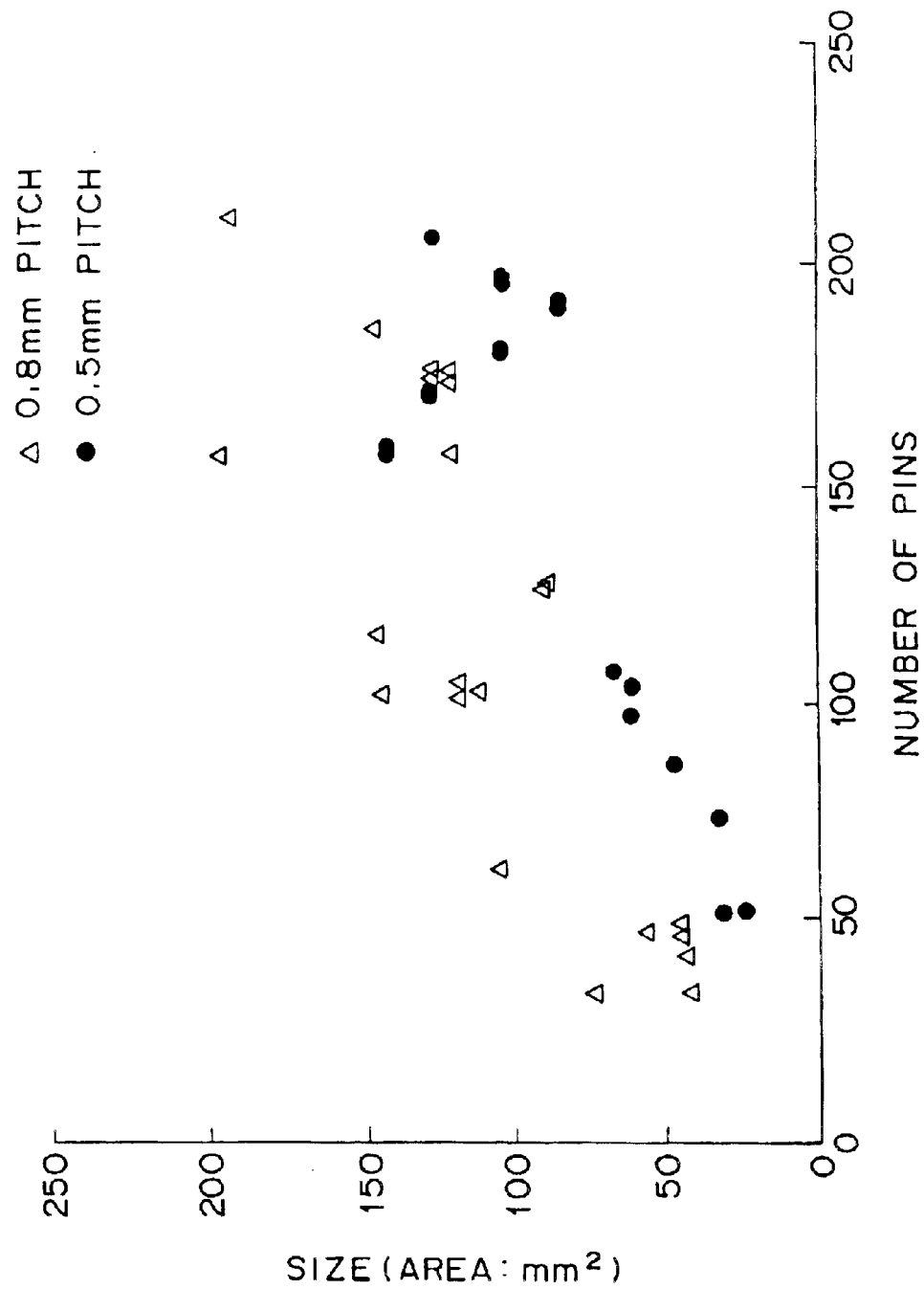
FIG. 6 is a graph showing the number of terminal pins and the package sizes for the main chip scale packages currently in use.
Figure 7A:
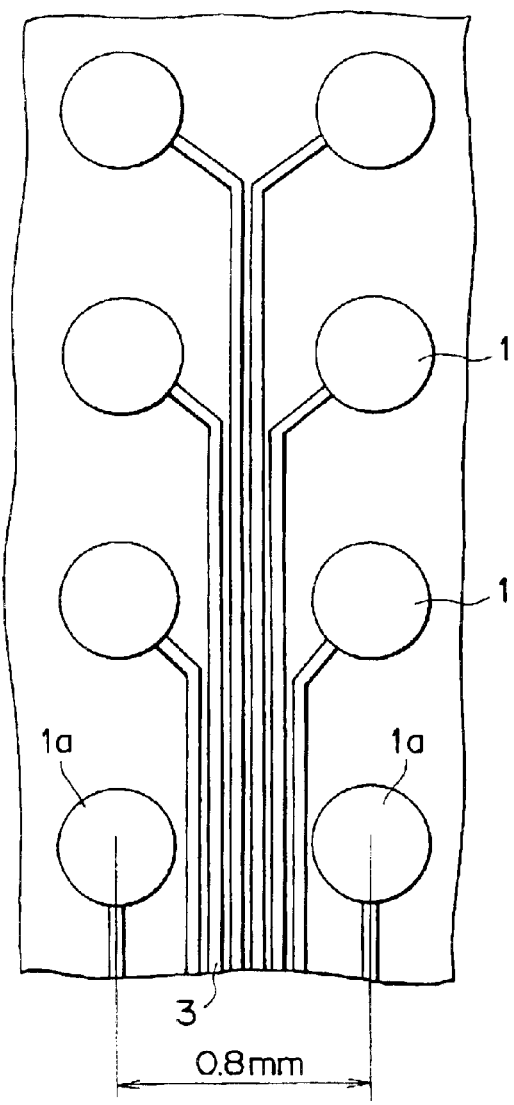
FIG. 7A(area terminals with 0.8 mm pitch and wiring) and FIG. 7B(area terminals with 0.5 mm pitch and wiring) are pattern views showing the area terminal array status and wiring in the conventional art.
Figure 7B:
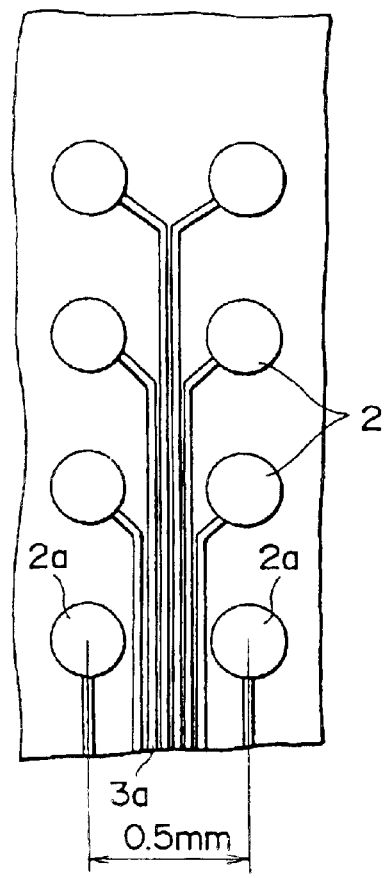
Figure 8A:
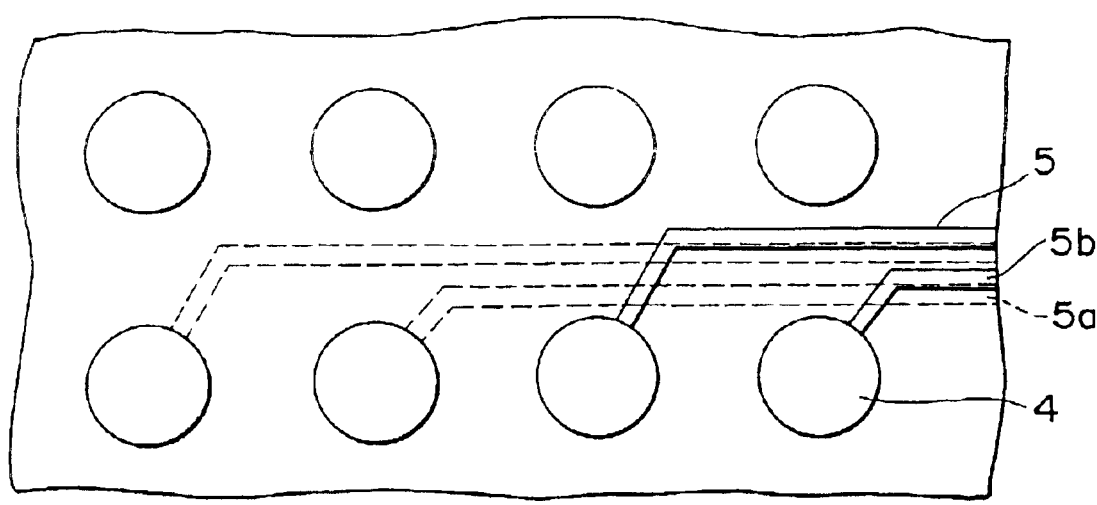
FIGS. 8A and 8B are respectively a pattern view (8A) and a cross sectional view (8B) showing the built-up multilayer wiring substrate of the conventional art.
Figure 8B:
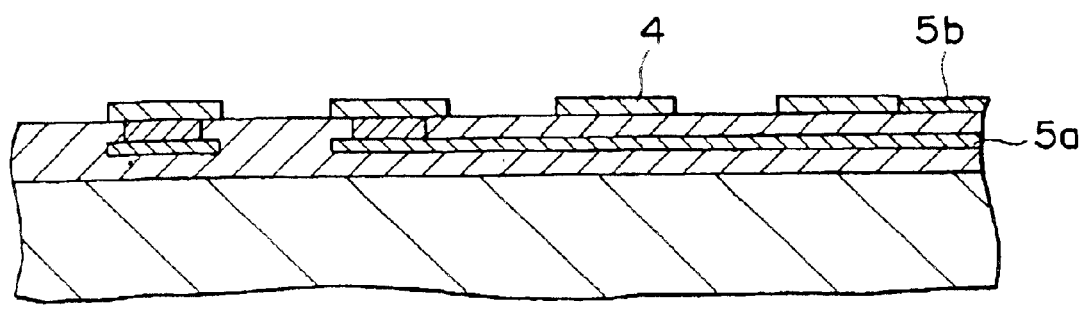

FIG. 4 shows the wiring status for a printed circuit board or a CSP interposer board. This figure illustrates how utilizing the terminal array of this invention can alleviate the wiring load. In FIG. 4 for example, even though the land terminal 15b or 15c (or area terminal) array has a small (fine) pitch of 0.5 mm, the pitch of the wiring 16 is determined by the land terminal 15a (or area terminal) on the outermost circumference of the board. Thus, not only semiconductor part be alleviated but the use of wires of greater width has the advantages of reducing the resistance in the wire and allowing high-speed, high frequency mounting.

As the above description clearly shows, one effect of the semiconductor part and the mounting structure of this invention is that the area terminals have a larger size on the outermost circumference where heat stress is most severe, and these area terminals exhibit a high contact strength more than sufficient to withstand heat stress after mounting.

Another effect of this invention is that since the area terminals have a smaller pitch toward the inner circumference, the number of pins can also be increased so the current and future trends towards an increased number of pins can be accommodated.

A still further effect of this invention is that with a larger pitch array the closer the area terminals are to the outermost circumference of the board, the benefit of space margin occurs for the wiring running between the outer terminals towards the inner terminals. This space margin makes mounting easier and alleviates the wiring load on the printed circuit board or in other words reduces the utilized, then resistance losses in the wiring can be reduced and high-speed, high frequency mounting achieved.

What is claimed is:

1. A method of mounting an interposer board to a printed circuit board, the interpose board comprising an outer circumferential side and an inner circumferential side, one or more area terminals arrayed on the outer circumferential side of the interposer board, and one or more area terminals arrayed on the inner circumferential side of the interposer board, the printed circuit board comprising an outer circumferential side and an inner circumferential side, one or more land terminals arrayed on the outer circumferential side of the printed circuit board, and one or more land terminals arrayed on the inner circumferential side of the printed circuit board, the method comprising:

(a) applying a conductive bonding solution to at least one of the area terminals arrayed on the outer circumferential side, the area terminals arrayed on the inner circumferential side, the land terminals arrayed on the outer circumferential side, and the land terminals arrayed on the inner circumferential side; and (b) connecting the area terminal arrayed on the outer circumferential side to the land terminal arrayed on the outer circumferential side, and the area terminal arrayed on the inner circumferential side to the land terminal arrayed on the inner circumferential side;

wherein the area terminal on the outer circumferential side is arrayed with a larger pitch than the area terminal on the inner circumferential side; and wherein the land terminal on the outer circumferential side is arrayed with a larger pitch than the land terminal on the inner circumferential side.

2. A method of mounting an interposer board to a printed circuit board, the interpose board comprising an outer circumferential side and an inner circumferential side, one or more area terminals arrayed on the outer circumferential side of the interposer board, and one or more area terminals arrayed on the inner circumferential side of the interposer board, the printed circuit board comprising an outer circumferential side and an inner circumferential side, one or more land terminals arrayed on the outer circumferential side of the printed circuit board, and one or more land terminals arrayed on the inner circumferential side of the printed circuit board, the method comprising:

(a) applying a conductive bonding solution to at least one of the area terminals arrayed on the outer circumferential side, the area terminals arrayed on the inner circumferential side, the land terminals arrayed on the outer circumferential side, and the land terminals arrayed on the inner circumferential side; and (b) connecting the area terminal arrayed on the outer circumferential side to the land terminal arrayed on the outer circumferential side, and the area terminal arrayed on the inner circumferential side to the land terminal arrayed on the inner circumferential side;

wherein the area terminal on the outer circumferential side is arrayed with a larger diameter than the area terminal on the inner circumferential side; and wherein the land terminal on the outer circumferential side is arrayed with a larger diameter than the land terminal on the inner circumferential side.

3. A method of mounting an interposer board to a printed circuit board, the interpose board comprising an outer circumferential side and an inner circumferential side, one or more area terminals arrayed on the outer circumferential side of the interposer board, and one or more area terminals arrayed on the inner circumferential side of the interposer board, the printed circuit board comprising art outer circumferential side and an inner circumferential side, one or more land terminals arrayed on the outer circumferential side of the printed circuit board, and one or more land terminals arrayed on the inner circumferential side of the printed circuit board, the method comprising:

(a) applying a conductive bonding solution to at least one of the area terminals arrayed on the outer circumferential side, the area terminals arrayed on the inner circumferential side, the land terminals arrayed on the outer circumferential side, and the land terminals arrayed on the inner circumferential side; and (b) connecting the area terminal arrayed on the outer circumferential side to the land terminal arrayed on the outer circumferential side, and the area terminal arrayed on the inner circumferential side to the land terminal arrayed on the inner circumferential side;

wherein the area terminal on the outer circumferential side is arrayed with a larger pitch and diameter than the area terminal on the inner circumferential side; and wherein the land terminal on the outer circumferential side is arrayed with a larger pitch and diameter than the land terminal on the inner circumferential side.

* * * * *